United States Patent [19]

Nomoto

[11] Patent Number: 6,080,995

[45] Date of Patent: Jun. 27, 2000

[54] QUANTUM DEVICE

[75] Inventor: Kazumasa Nomoto, Kanagawa, Japan

[73] Assignee: Sony Corporation, Tokyo, Japan

[21] Appl. No.: 09/089,389

[22] Filed: Jun. 3, 1998

[30] Foreign Application Priority Data

Jun. 4, 1997 [JP] Japan ................................ 9-146802

[51] Int. Cl.[7] ................................................. H01L 29/06
[52] U.S. Cl. ................................ 257/20; 257/24; 257/25; 257/194
[58] Field of Search ................................ 257/20, 24, 25, 257/192, 194

[56] References Cited

U.S. PATENT DOCUMENTS 5,629,231  5/1997  Kiehl ........................................ 438/509
5,714,766  2/1998  Chen et al. ................................ 257/17

Primary Examiner—Sara Crane
Attorney, Agent, or Firm—Hill & Simpson

[57] ABSTRACT

A quantum device functioning as a memory device is provided for allowing high-speed writing and erasing of data with a low gate voltage. A source electrode and a drain electrode are formed on a substrate. A gate electrode is formed between the source and drain electrodes. Between the substrate and the gate electrode, a first barrier layer, a first quantum well layer, a second barrier layer, a second quantum well layer and a third barrier layer are stacked to form coupled quantum well layer. The thickness of each of the first and second barrier layers allows electron tunneling. The thickness of the third barrier layer does not allow electron tunneling. The energy level of the first quantum well layer is higher than the Fermi level of a conduction layer. The energy level of the second quantum well layer is lower than the energy level of the first quantum well layer. With an application of voltage to the gate electrode, a transition of electrons takes place by means of tunneling through the first quantum well layer to the second quantum well layer and the electrons are accumulated therein.

14 Claims, 10 Drawing Sheets

006,080,995

QUANTUM DEVICE

BACKGROUND OF THE INVENTION

1. Field of the Invention

The present invention relates to a quantum device using a quantum well layer.

2. Description of the Related Art

A semiconductor memory such as an electrically erasable and programmable read only memory (EEPROM) and a flash memory comprises a layer for accumulating electrons or holes surrounded by an insulator (such as a silicon dioxide film) placed between a substrate and a gate electrode of a metal oxide semiconductor (MOS) transistor. With an application of high voltage to the gate electrode and between source and drain electrodes of such a semiconductor memory, electrons or holes are conducted through the insulator by means of the tunnel effect. The electrons or holes are thereby accumulated in the accumulation layer. A difference in the number of electrons or holes is retained as a difference in data. The retained data is read through utilizing a fact that a current flowing between the source and drain electrodes changes in response to the number of electrons or holes accumulated in the accumulation layer.

A device for modulating a current, represented by a field effect transistor and a bipolar transistor, is capable of changing the magnitude of current flowing between the source and drain electrodes in accordance with a control voltage applied to the gate electrode.

However, the semiconductor memory and the device modulating a current described above each have the following problems. It is required to increase the thickness of the insulator of the semiconductor memory so that data is retained for an adequately long period. It is therefore required that a high voltage is applied to the gate electrode so as to perform writing and erasing of data within a practical span of time. It is thus difficult to achieve microstructuring of the device. The semiconductor memory further requires a feedback circuit for controlling the number of electrons or holes accumulated in the accumulation layer with a period in which a voltage is applied to the gate electrode. Consequently it takes a long time for writing and erasing of data and power consumption increases.

For the device modulating a current, a control voltage and a current are determined as a one-valued function. It is therefore required that a plurality of devices are coupled to each other with wiring for producing a function element such as a logic device. Such wiring increases floating resistance and floating capacitance so that high-speed operation is restricted. Power consumption and device size as a whole increase as well due to a plurality of devices coupled to each other.

SUMMARY OF THE INVENTION

It is an object of the invention to provide a quantum device, suitable for a memory device, achieving high-speed writing and erasing of data with a low gate voltage, consuming less power and allowing higher integration.

It is another object of the invention to provide a quantum device, suitable for a device modulating a current, wherein a control voltage value and a current value change as a many-valued function, for achieving high-speed current modulation, consuming less power and allowing higher integration.

A quantum device of the invention comprises: a conduction layer through which a current flows and a coupled quantum well layer including a plurality of quantum well layers and placed adjacent to the conduction layer.

Another quantum device of the invention comprises: a conduction layer through which a current flows; an accumulation layer in which electrons or holes transited from the conduction layer are accumulated; and a transition layer including a quantum well layer effecting a transition of electrons or holes from the conduction layer to the accumulation layer.

In the quantum device of the invention, a forward-biased voltage is applied between the conduction layer and the coupled quantum well layer. A transition of electron or holes in the conduction layer to the coupled quantum well layer thereby takes place by means of quantum tunneling. If a reverse-biased voltage is applied between the conduction layer and the coupled quantum well layer, a transition of electron or holes accumulated in the coupled quantum well layer to the conduction layer takes place by means of quantum tunneling. Electrons or holes are thus accumulated in the coupled quantum well layer and data is thereby stored. The current flowing through the conduction layer thereby changes as a many-valued function.

In the other quantum device of the invention, a forward-biased voltage is applied between the conduction layer and the accumulation layer. A transition of electron or holes in the conduction layer to the accumulation layer thereby takes place through the transition layer. Electrons or holes are thus accumulated in the accumulation layer and data is thereby stored. The data is read by utilizing a fact that a current flowing through the conduction layer changes in accordance with the number of electrons or holes accumulated in the accumulation layer. If a reverse-biased voltage is applied between the conduction layer and the accumulation layer, a transition of electron or holes accumulated in the accumulation layer to the conduction layer takes place through the transition layer. The data is thereby erased. Since the transition layer includes the quantum well layer, the transition of electrons or holes takes place by means of resonance tunneling. As a result, writing and erasing of data is performed at high speed with low power.

Other and further objects, features and advantages of the invention will appear more fully from the following description.

DETAILED DESCRIPTION OF THE PREFERRED EMBODIMENT

Preferred embodiments of the invention will now be described in detail with reference to the accompanying drawings.

First Embodiment

Figure 1:
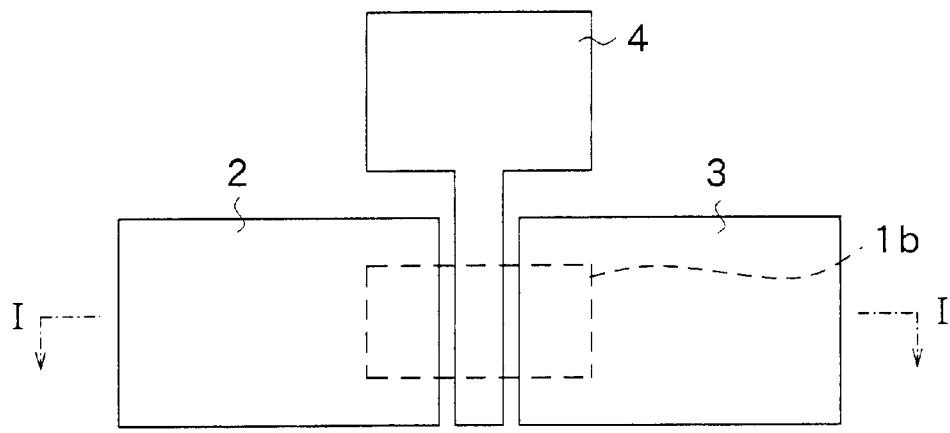
FIG. 1 is a top view for illustrating the configuration of a quantum device of a first embodiment of the invention.
Figure 2:
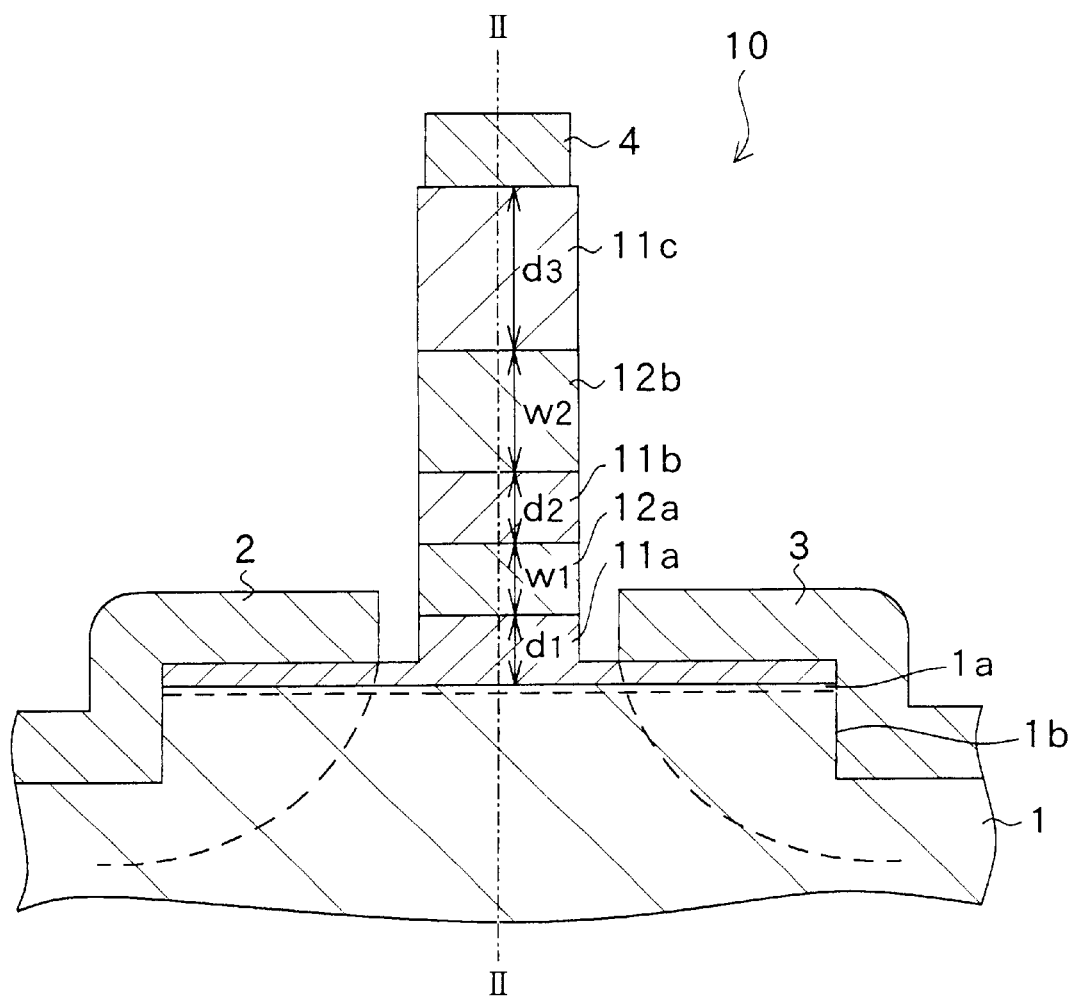
FIG. 2 is a cross section of the quantum device shown in FIG. 1 taken along line I—I.

FIG. 1 is a top view for illustrating the configuration of a quantum device of a first embodiment of the invention. FIG. 2 is a magnified cross section of the quantum device shown in FIG. 1 taken along line I—I. The quantum device functions as a memory device. The quantum device comprises a source electrode 2 and a drain electrode 3 each made of metal and formed with a space in between, each on a side of a convex 1b provided on a semiconductor substrate 1. A gate electrode 4 made of metal is formed between the source electrode 2 and the drain electrode 3 on the substrate 1 with a coupled quantum well layer 10 in between. Two-dimensional electron gas (2DEG) is accumulated between the source electrode 2 and the drain electrode 3 on the substrate 1 and a conduction layer 1a is formed as a current passage. Ohmic contacts are made each between the conduction layer 1a and the source electrode 2 and between the conduction layer 1a and the drain electrode 3. No ohmic contact is established between the gate electrode 4 and the coupled quantum well layer 10 (that is, a barrier layer 11c described below).

The substrate 1 is made of, for example, GaAs, InAs, InGaAs mixed crystal, silicon (Si) or germanium (Ge). The gate electrode 4 is made of aluminum (Al) or gold (Au), for example. The coupled quantum well layer 10 is a multilayer quantum well wherein quantum tunneling is allowed among the layers. As shown in FIG. 2, the coupled quantum well layer 10 with two quantum well layers will be described. The coupled quantum well layer 10 comprises a barrier layer 11a, a quantum well layer 12a closer to the conduction layer 1a, a barrier layer 11b, a quantum well layer 12b opposite to the conduction layer 1a and a barrier layer 11c, each stacked on the substrate 1 in this order. The barrier layer 11a, the quantum well layer 12a and the barrier layer 11b function as transition layers of the memory device for effecting a transition of electrons in the conduction layer 1a to the quantum well layer 12b. The quantum well layer 12b functions as an accumulation layer of the memory device for accumulating the electrons through the transition.

The quantum well layers 12a and 12b are each made of, for example, GaAs, InAs, InGaAs mixed crystal, silicon or germanium. The barrier layers 11a, 11b and 11c are each made of AlGaAs mixed crystal if the quantum well layers 12a and 12b are each made of GaAs. The barrier layers 11a, 11b and 11c are each made of GaAs, AlGaAs mixed crystal, GaSb or AlGaSb mixed crystal if the quantum well layers 12a and 12b are each made of InAs or InGaAs mixed crystal.

The barrier layers 11a, 11b and 11c are each made of silicon dioxide ($SiO_2$) if the quantum well layers 12a and 12b are each made of silicon. The barrier layers 11a, 11b and 11c are each made of silicon if the quantum well layers 12a and 12b are each made of germanium.

Thicknesses $d_1$ and $d_2$ of the barrier layers 11a and 11b each allow tunneling of electrons or holes (50 nm or below, for example). Thickness $d_3$ of the barrier layer 11c makes tunneling of electrons or holes difficult (50 nm or above, for example). The total thickness of the barrier layer 11a, the quantum well layer 12a and the barrier layer 11b ($d_1+w_1+d_2$) makes tunneling of electrons or holes difficult. Thickness $w_1$ of the quantum well layer 12a is preferably 1 μm or below with which discretization of energy level is accelerated (5 nm, for example, with which the discretization energy gap is sufficiently greater than thermal energy 26 meV at room temperature). Thickness $w_1$ is determined such that the discretization energy width of degree of freedom in the direction of thickness is sufficiently greater than $k_B T$ where $k_B$ is the Boltzmann constant=$1.38\times10^{-23}$ J/ K and T is the absolute temperature of the device. Thickness $w_2$ of the quantum well layer 12b is determined such that the energy level of the quantum well layer 12b is lower than that of the quantum well layer 12a.

Figure 3:
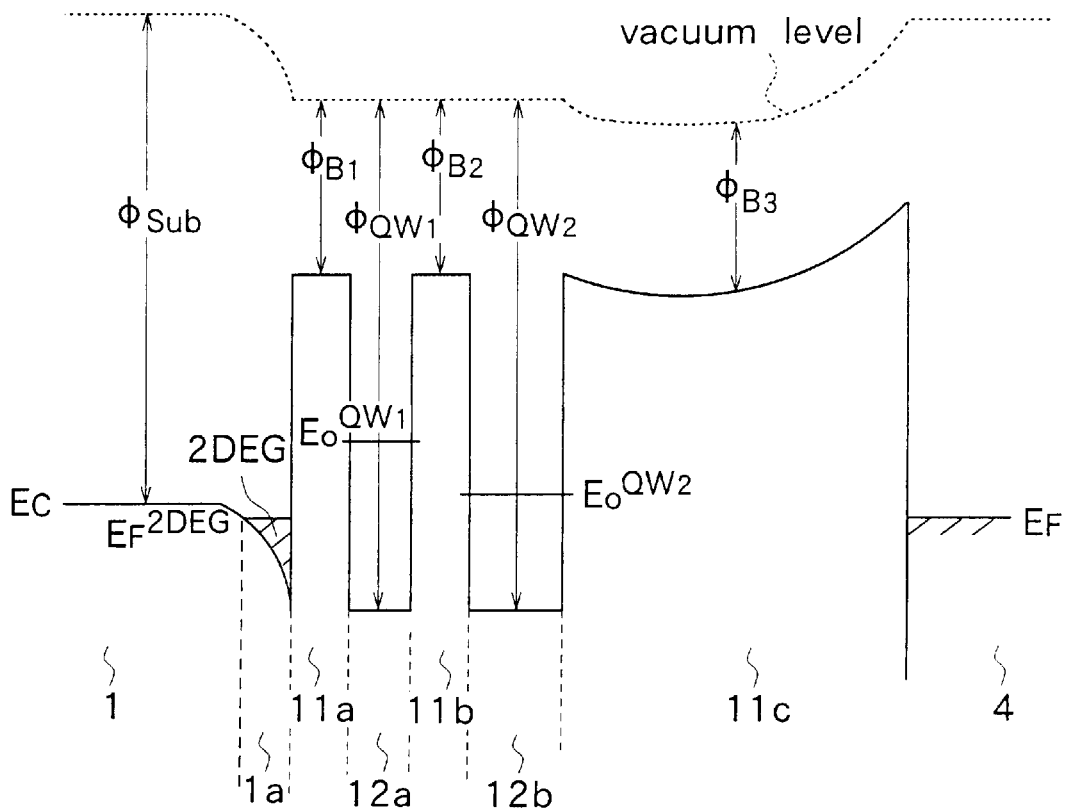
FIG. 3 illustrates an energy band structure of the quantum device shown in FIG. 2 taken along line II—II.

FIG. 3 illustrates an energy band structure taken along line II—II in FIG. 2 in a thermal equilibrium state. Although the barrier layer 11c is of n type in FIG. 3 for facilitating description, the barrier layer 11c may be either of p type or intrinsic.

In the quantum device, electron affinity $\phi_{Sub}$ of a substance making up the substrate 1 and electron affinities $\phi_{QW1}$ and $\phi_{QW2}$ of substances each making up the quantum well layers 12a and 12b, respectively, are each greater than electron affinities $\phi_{B1}$, $\phi_{B2}$ and $\phi_{B3}$ of substances each making up the barrier layers 11a, 11b and 11c, respectively. The minimum energy level $E_0^{QW1}$ of electrons localized in the quantum well layer 12a is greater than the Fermi level $E_F^{2DEG}$ of the conduction layer 1a, that is, of two-dimensional electron gas. Furthermore, the minimum energy level $E_0^{QW1}$ of electrons localized in the quantum well layer 12a is greater than the minimum energy level $E_0^{QW2}$ of electrons localized in the quantum well layer 12b as shown in formula (1) below. As a result, electrons accumulated in the quantum well layer 12b will not leak towards the substrate 1 in a short time.

$$E_0^{QW1} \leq E_0^{QW2}+k_B T \qquad (1)$$

where $k_B$ is the Boltzmann constant=$1.38\times10^{-23}$ J/ K and T is the absolute temperature of the device.

The quantum device with such a configuration functions as follows.

Figure 4:
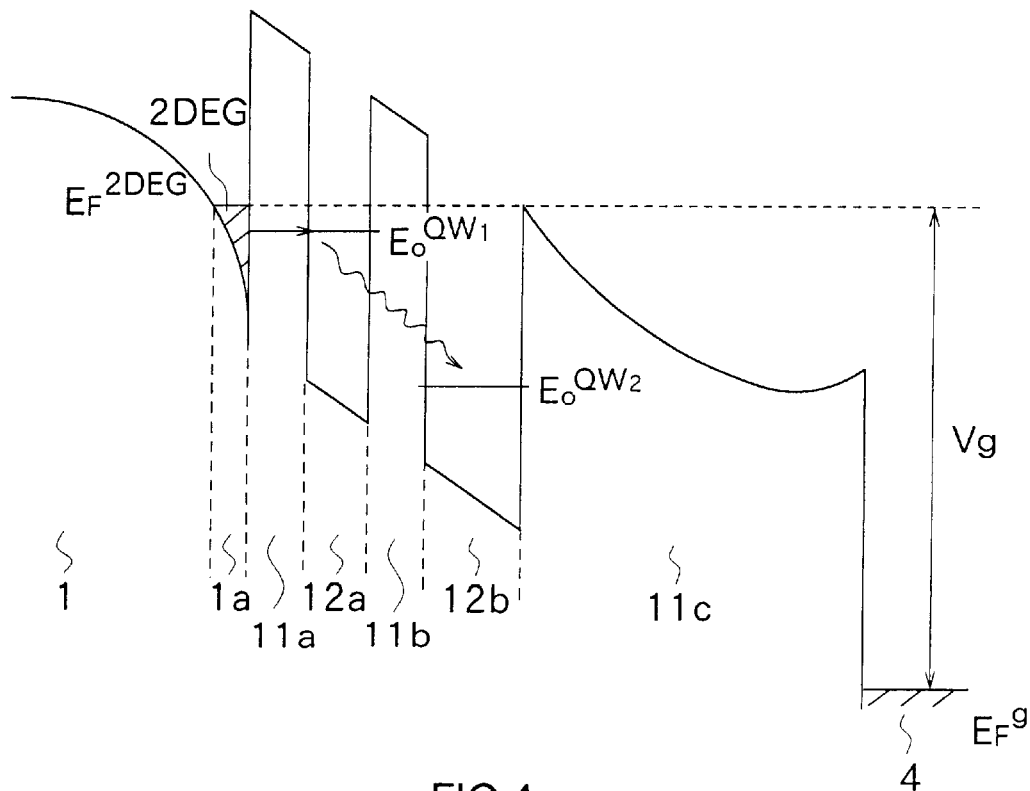
FIG. 4 illustrates an energy band structure of the quantum device shown in FIG. 1 for describing writing of data.

As shown in FIG. 4, data is written in the quantum device through applying forward-biased positive gate voltage Vg to the gate electrode 4. In FIG. 4, the Fermi level of the gate electrode 4 is represented by $E_F^g$.

If gate voltage Vg is less than the value shown in FIG. 4 and $E_F^{2DEG}$ is less than $E_0^{QW1}$, the energy of electrons in the conduction layer 1a is not high enough to allow a transition of the electrons to the quantum well layer 12a. A transition of the electrons to the quantum well layer 12b as the accumulation layer is therefore not achieved.

However, if gate voltage Vg is applied so that $E_F^{2DEG}$ is greater than $E_0^{QW1}$ as shown in FIG. 4, a transition of the energy of electrons in the conduction layer 1a to the quantum well layer 12a is achieved through energy level $E_0^{QW1}$. The transition results from resonance tunneling between the conduction layer 1a and the quantum well layer 12a so that the transition takes place at exceedingly high speed. The minimum gate voltage $Vg^{min}$ required for the transition is represented by formula (2) below.

$$Vg^{min} \approx (E_0^{QW1} - E_F^{2DEG})/e \times \{(d_1+w_1+d_2+w_2+d_3)/d_1\} \quad (2)$$

For example, the substrate 1 and the quantum well layers 12a and 12b are each assumed to be made of GaAs and the barrier layers 11a, 11b and 11c are each assumed to be made of AlGaAs mixed crystal. Thickness $d_1$ of the barrier layer 11a is assumed to be 10 nm, thickness $w_1$ of the quantum well layer 12a to be 7 nm, thickness $d_2$ of the barrier layer 11b to be 20 nm, thickness $w_2$ of the quantum well layer 12b to be 50 nm, and thickness $d_3$ of the barrier layer 11c to be 100 nm. In this example the value of $E_0^{QW1} - E_F^{2DEG}$ is of the order of 0.1 eV and minimum gate voltage $Vg^{min}$ is approximately 1.87 V. A flash memory currently available requires a gate voltage of approximately 10 V for writing of data. Therefore the quantum device of the embodiment of the invention achieves writing of data with lower gate voltage Vg.

Figure 5:
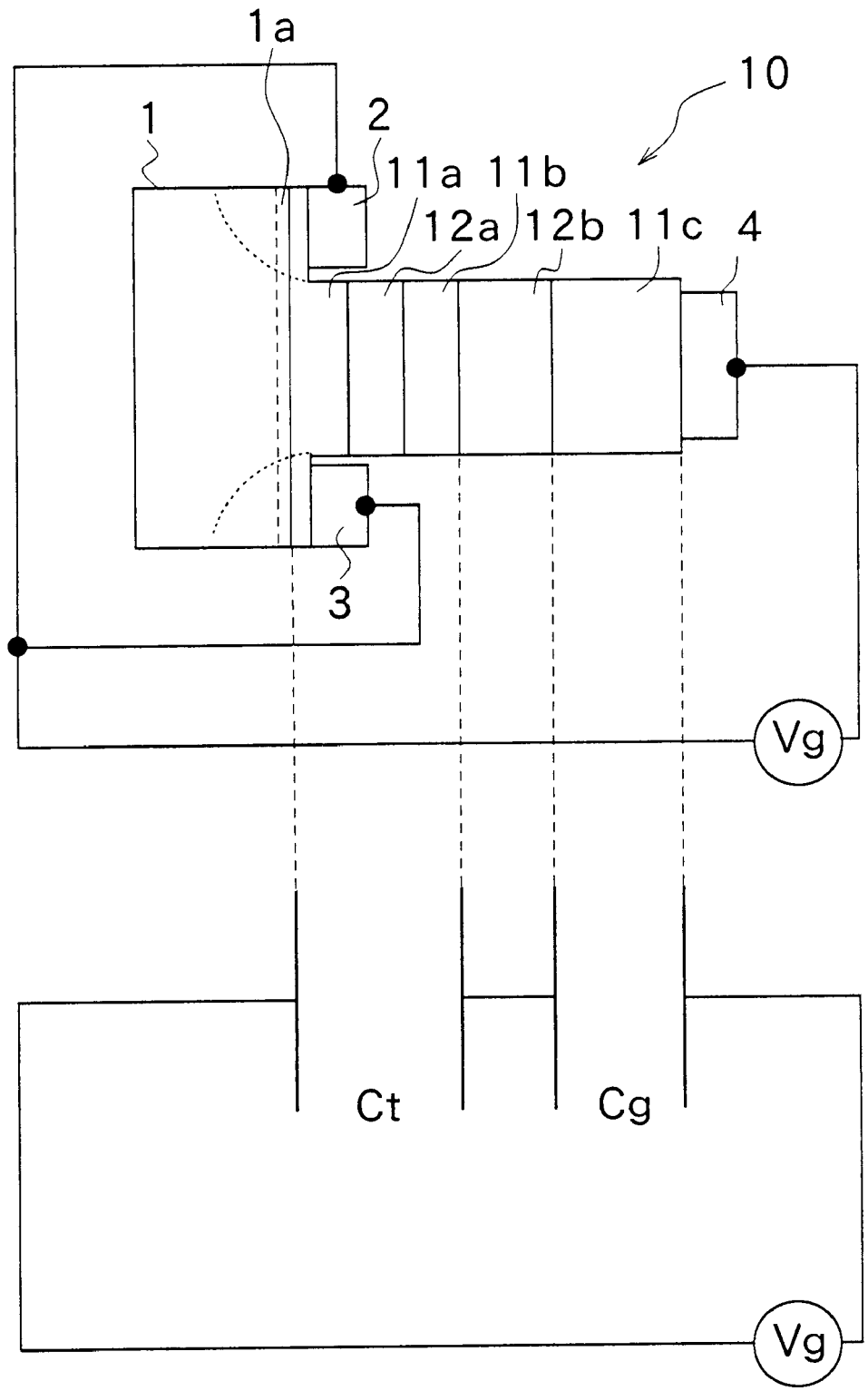
FIG. 5 is a block diagram of equivalent circuit of the quantum device shown in FIG. 1.

The number of electrons accumulated in the quantum well layer 12b is controlled with gate voltage Vg instead of the writing time (the time during which gate voltage Vg is applied). This is because writing of data in the quantum device is achieved at high speed with low gate voltage Vg as described above. For example, if gate voltage Vg lower than minimum gate voltage $Vg^{min}$ is applied to the gate electrode 4 as shown in FIG. 4, the number of electrons accumulated in the quantum well layer 12b is zero. In contrast, if gate voltage Vg higher than minimum gate voltage $Vg^{min}$ is applied to the gate electrode 4, the number of electrons accumulated in the quantum well layer 12b is $N^{max}$ shown in formula (3) below, the quantum device being replaced with the equivalent circuit shown in FIG. 5.

$$N^{max} = (E_0^{QW1} - E_0^{QW2}) Ctot/e^2 \quad (3)$$

where Ctot is Ct+Cg; Ct is the capacitance between the conduction layer 1a and the quantum well layer 12b; Cg is the capacitance between the quantum well layer 12b and the gate electrode 4; and e is the elementary electric charge.

Figure 6:
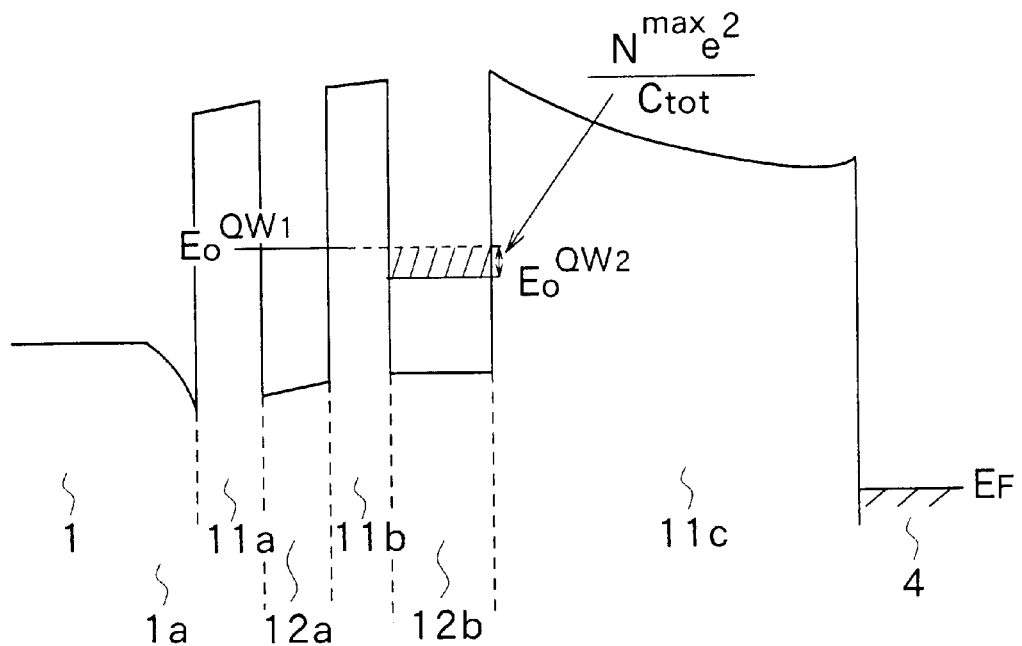
FIG. 6 illustrates an energy band structure of the quantum device shown in FIG. 1 for describing writing of data.

The electrons of $N^{max}$ in number are accumulated in the quantum well layer 12b as thus described and then gate voltage Vg is returned to zero. The energy band is thereby structured as shown in FIG. 6.

Figure 7:
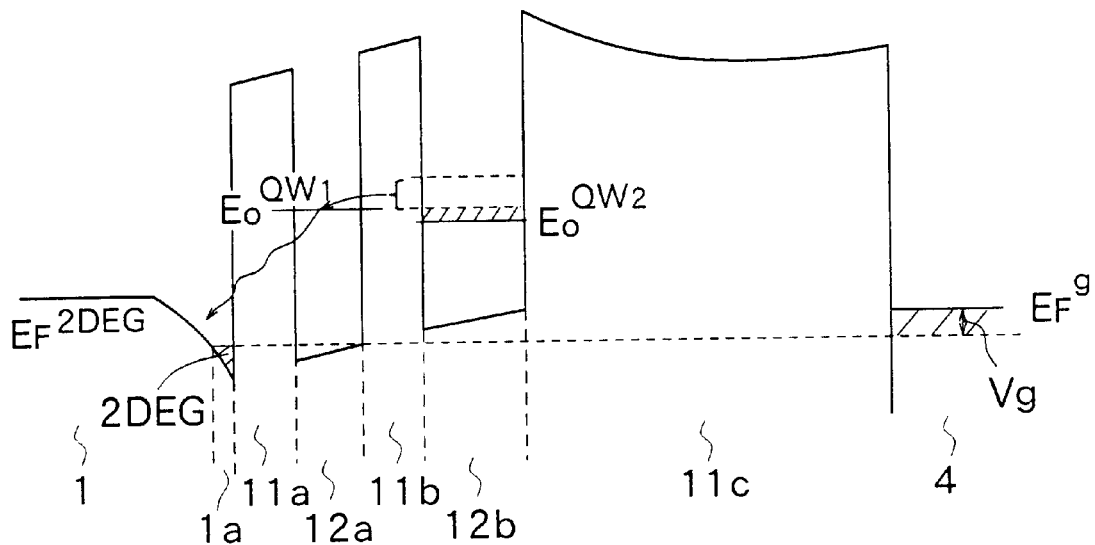
FIG. 7 illustrates an energy band structure for describing the operation following FIG. 6.

As shown in FIG. 7, reverse-biased negative gate voltage Vg is then applied to the gate electrode 4. A transition of part of electrons accumulated in the quantum well layer 12b to the conduction layer 1a takes place through the quantum well layer 12a. The number $N^{max}$ of electrons remaining in the quantum well layer 12b is expressed by formula (4) below. The number $N^{max}$ of electrons accumulated in the quantum well layer 12b is thus controlled with gate voltage Vg.

$$N^{max} = (E_0^{QW1} - E_0^{QW2}) Ctot/e^2 + CgVg/e \quad (4)$$

Figure 8:
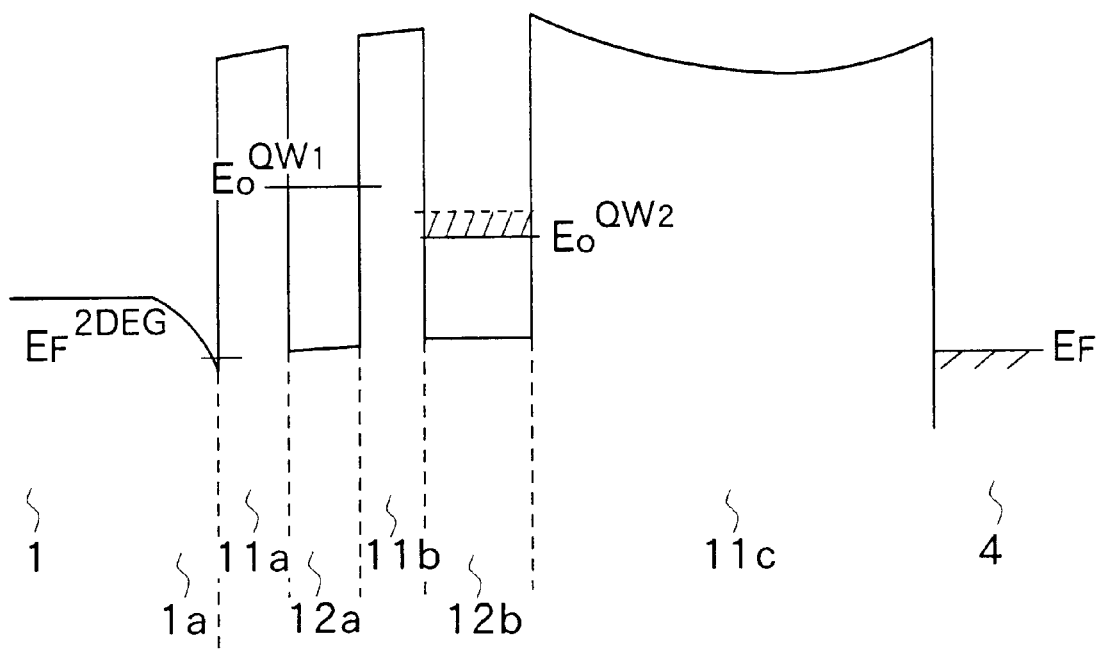
FIG. 8 illustrates an energy band structure for describing the operation following FIG. 7.

The electrons are accumulated in the quantum well layer 12b as thus described and then gate voltage Vg is returned to zero. The energy band is thereby structured as shown in FIG. 8. While gate voltage Vg is zero, the quantum well layer 12a functions as the potential barrier against the electrons accumulated in the quantum well layer 12b. The probability of transition of electrons from the quantum well layer 12a to the conduction layer 1a is very low. Electrons are therefore accumulated in the quantum well layer 12a in a nonvolatile manner.

Data written in the quantum device as described so far is read through measuring a current flowing through the conduction layer 1a. The current value changes with the number of electrons accumulated in the quantum well layer 12b.

Figure 9:
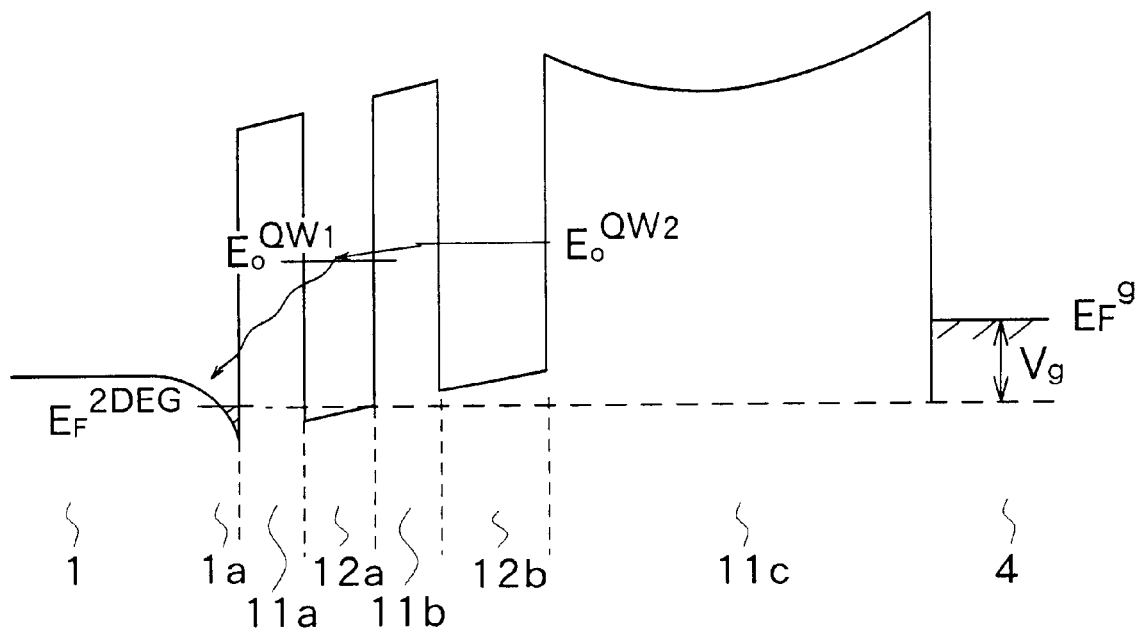
FIG. 9 illustrates an energy band structure of the quantum device shown in FIG. 1 for describing erasing of data.

As shown in FIG. 9, the data written in the quantum device is erased through applying reverse-biased negative gate voltage Vg to the gate electrode 4 so that $E_0^{QW1}$ goes lower than $E_0^{QW2}$. Consequently a transition of electrons accumulated in the quantum well layer 12b to the conduction layer 1a takes place through the quantum well layer 12a. While gate voltage Vg is returned to zero, the quantum well layer 12a functions as the potential barrier against the electrons in the conduction layer 1a. The probability of transition of electrons from the conduction layer 1a to the quantum well layer 12b is therefore very low.

The quantum device of the invention may be manufactured as described below. In the quantum device to be specifically described, the substrate 1 is made of GaAs and the barrier layers 11a, 11b and 11c are each made of AlGaAs mixed crystal. The quantum well layers 12a and 12b are each made of GaAs.

Figure 10A:
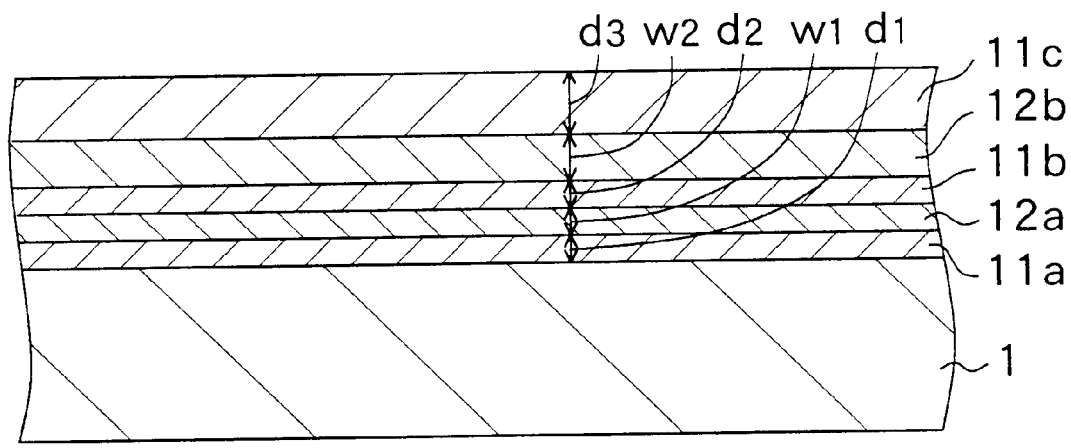
FIG. 10A and FIG. 10B are cross sections for illustrating a manufacturing step of the quantum device shown in FIG. 1.
Figure 10B:
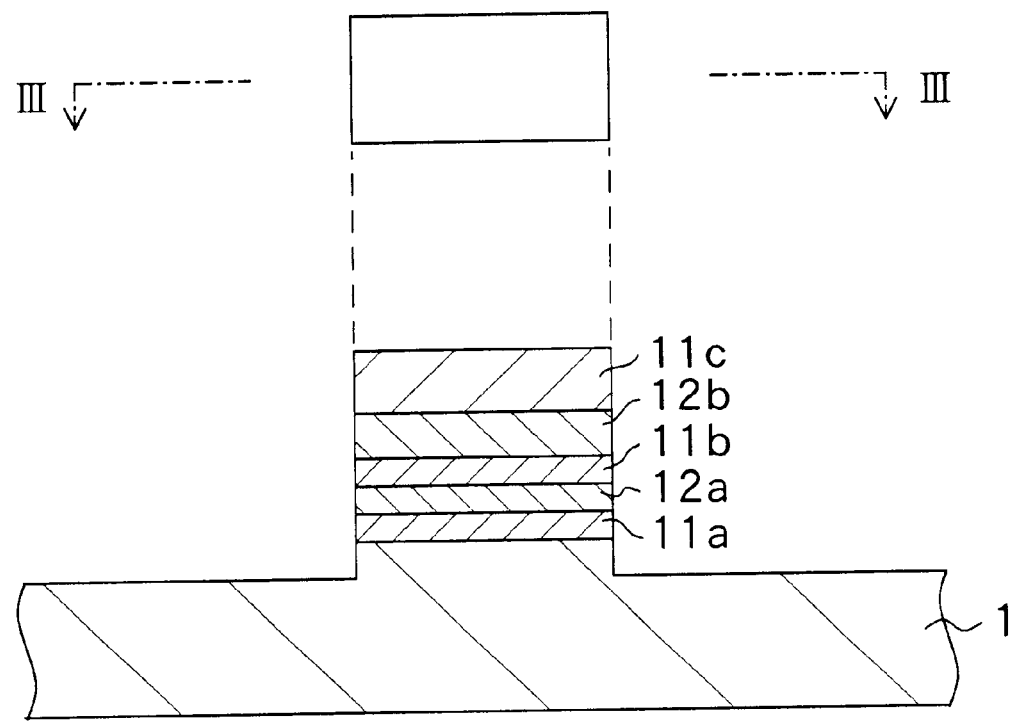
Figure 11A:
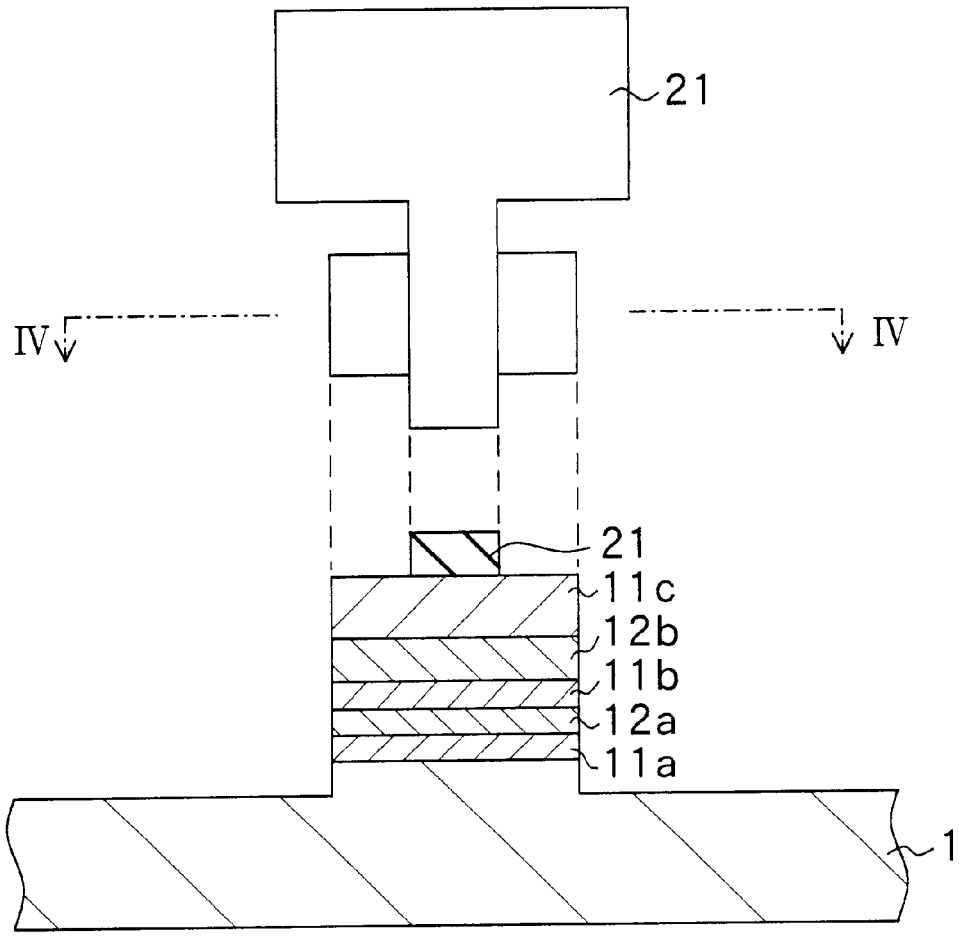
FIG. 11A and FIG. 11B are cross sections for illustrating a manufacturing step following FIG. 10A and FIG. 10B.
Figure 11B:
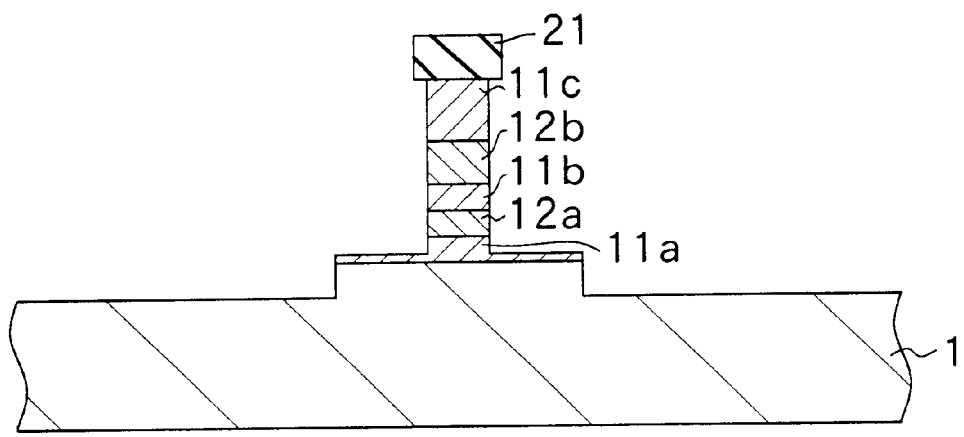
Figure 12:
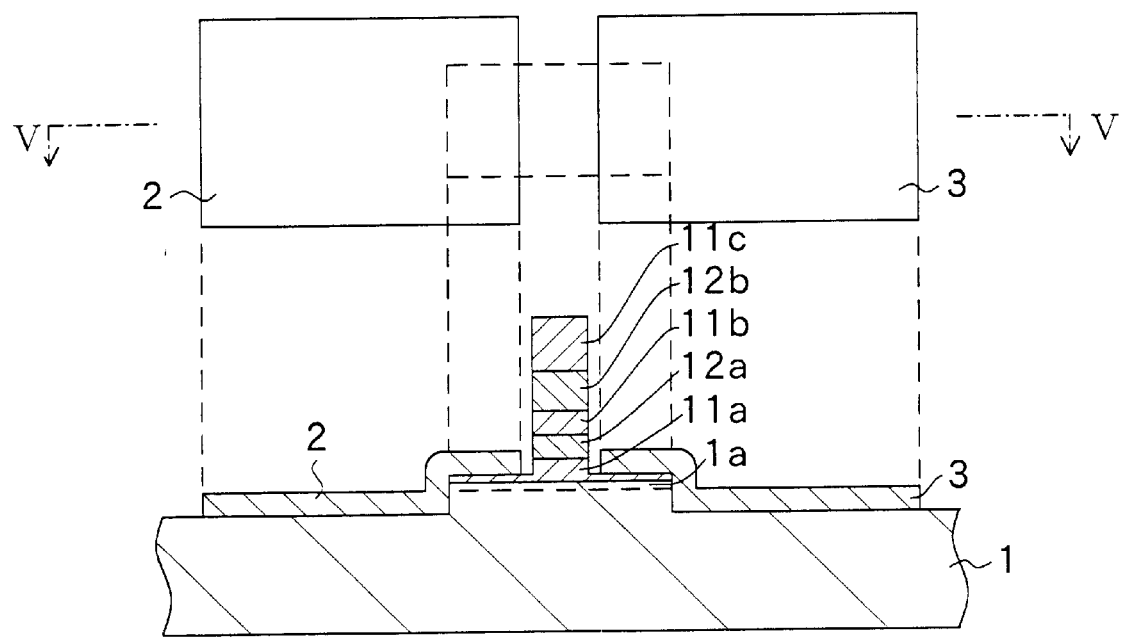
FIG. 12 is a cross section for illustrating a manufacturing step following FIG. 11.
Figure 13:
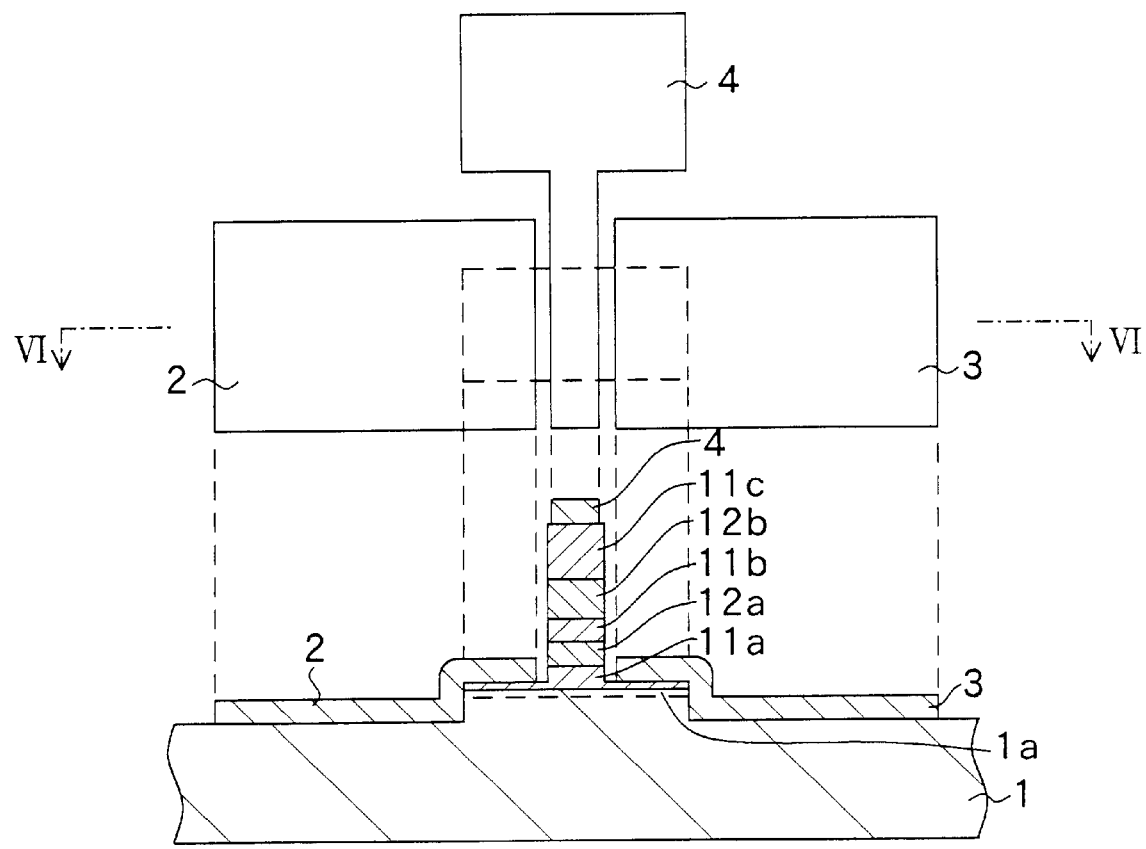
FIG. 13 is a cross section for illustrating a manufacturing step following FIG. 12.

FIG. 10A and FIG. 10B to FIG. 13 illustrate manufacturing steps of the quantum device. FIG. 10B illustrates a top view and a cross section taken along line III—III. FIG. 11A illustrates a top view and a cross section taken along line IV—IV FIG. 12 illustrates a top view and a cross section taken along line V—V FIG. 13 illustrates a top view and a cross section taken along line VI—VI.

First, as shown in FIG. 10A, the barrier layer 11a of thickness $d_1$, the quantum well layer 12a of thickness $w_1$, the barrier layer 11b of thickness $d_2$, the quantum well layer 12b of thickness $w_2$ and the barrier layer 11c of thickness $d_3$ are stacked on the substrate 1 in this order. This stacking process may be achieved through molecular beam epitaxy (MBE), metal organic chemical vapor deposition (MOCVD) or metal organic molecular beam epitaxy (MOMBE).

Next, as shown in FIG. 10B, the stacked layers are etched as far as the substrate 1 through optical lithography or electron beam lithography, for example, for device isolation. An etchant may be an aqueous solution of phosphoric acid ($H_3PO_4$), hydrogen chloride (HCl), sulfuric acid ($H_2SO_4$), ammonium hydroxide ($NH_4OH$), or potassium hydroxide (KOH). Alternatively, a solution of any of these to which an aqueous solution of hydrogen peroxide is added may be used As shown in FIG. 11A, an etchant-resistant mask layer 21 is then formed with photoresist, silicon dioxide or silicon nitride ($Si_3N_4$) in the region where the gate electrode is to be formed on the barrier layer 11c and the substrate 1.

As shown in FIG. 11B, anisotropic dry etching is performed with the mask layer 21 in the direction orthogonal to the surface of the substrate 1 as far as a midway of the barrier layer 11a. This etching may be performed through reactive ion etching (RIE) using either a methane gas ($CH_4$) with a helium (He) gas or a silicon tetrachloride ($SiCl_4$) gas with a helium (He) gas or a chlorine ($Cl_2$) gas or reactive ion beam etching using electron cyclotron resonance (ECR-RIBE). In this process the width of each of the barrier layers 11a, 11b and 11c and the quantum well layers 12a and 12b is required to be less than that of the mask layer 21. This may be achieved through increasing the etching gas pressure and patterning the mask layer 21 so that easy-to-etch surfaces are exposed to the sides.

After the etching as thus described, metal layers are formed for fabricating the source electrode 2 and the drain electrode 3 on the substrate 1 through vacuum deposition or spattering, for example. An AuGe layer, a nickel (Ni) layer and a gold (Au) layer, for example, are stacked one after another. The mask layer 21 is then lifted off and the source electrode 2 and the drain electrode 3 are formed as shown in FIG. 12. Next, annealing is performed at a temperature of the order of 400° C. and the source electrode 2 and the drain electrode 3 are thereby alloyed with the barrier layer 11a and the substrate 1 underneath. An ohmic contact is thus established between the conduction layer 1a formed on the substrate 1 and each of the source electrode 2 and the drain electrode 3.

After the formation of the source electrode 2 and the drain electrode 3, the gate electrode 4 is formed with an appropriate metal such as aluminum or gold, as shown in FIG. 13, through optical lithography, electron beam lithography, and lifting-off. The quantum device of the embodiment is thus fabricated.

As described so far, the quantum device of the embodiment comprises the coupled quantum well layer 10 including the quantum well layer 12b as the accumulation layer and the quantum well layer 12a forming the transition layer. Data storage is therefore carried out by means of resonance tunneling to the quantum well layer 12b through the quantum well layer 12a. As a result, data storage is performed at exceedingly high speed with low gate voltage Vg. Power consumed for writing and erasing of data is therefore reduced. Microstructuring of the device is achieved as well.

Furthermore, the number of electrons accumulated in the quantum well layer 12b is controllable with gate voltage Vg. Peripheral circuitry for controlling the electric charge is therefore no more required. As a result, power consumption is reduced and the chip size is reduced as well.

Second Embodiment

Figure 14:
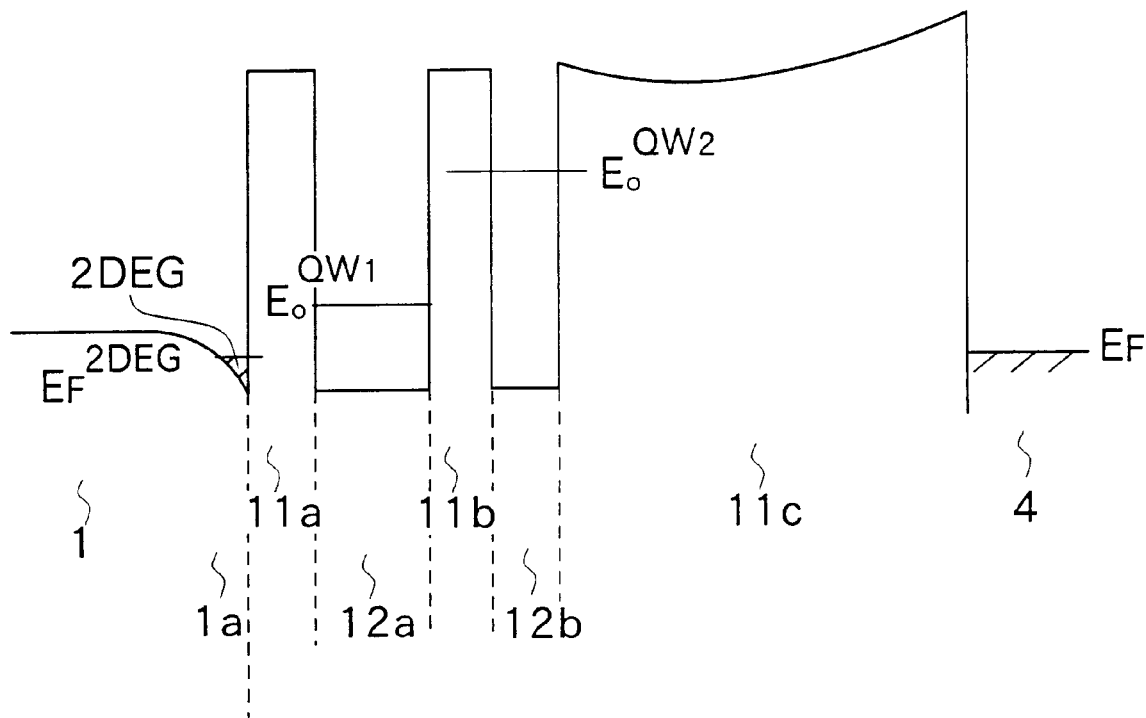
FIG. 14 illustrates an energy band structure of a quantum device of a second embodiment of the invention.

FIG. 14 illustrates an energy band structure of a quantum device of a second embodiment of the invention. Thicknesses $w_1$ and $w_2$ of the quantum well layer 12a and 12b, respectively, and the function of the quantum device of the second embodiment are different from those of the quantum device of the first embodiment. The remainder of configuration of the quantum device of the second embodiment is similar to that of the quantum device of the first embodiment. Like numerals are assigned to like components and detailed description thereof will be omitted.

The quantum device functions as a device modulating a current flowing through the conduction layer 1a. As shown in FIG. 14, thicknesses $w_1$ and $w_2$ of the quantum well layer 12a and 12b, respectively, are determined so that the minimum energy level $E_0^{QW1}$ of electrons localized in the quantum well layer 12a in a thermal equilibrium state is lower than the minimum energy level $E_0^{QW2}$ of electrons localized in the quantum well layer 12b.

With an application of forward-biased positive gate voltage Vg to the gate electrode 4, the number of electrons accumulated in the conduction layer 1a increases with an increase in the gate voltage and the current thereby increases as long as Fermi level $E_F^{2DEG}$ of the conduction layer 1a is lower than the minimum energy level $E_0^{QW1}$ of electrons localized in the quantum well layer 12a.

With a further application of positive gate voltage Vg, Fermi level $E_F^{2DEG}$ of the conduction layer 1a becomes equal to minimum energy level $E_0^{QW1}$ of electrons localized in the quantum well layer 12a. A transition of part of electrons in the conduction layer 1a to the quantum well layer 12a thus takes place. Since the electrons in the quantum well layer 12a through the transition do not contribute to conduction in the conduction layer 1a, the current flowing through the conduction layer 1a decreases.

Figure 15:
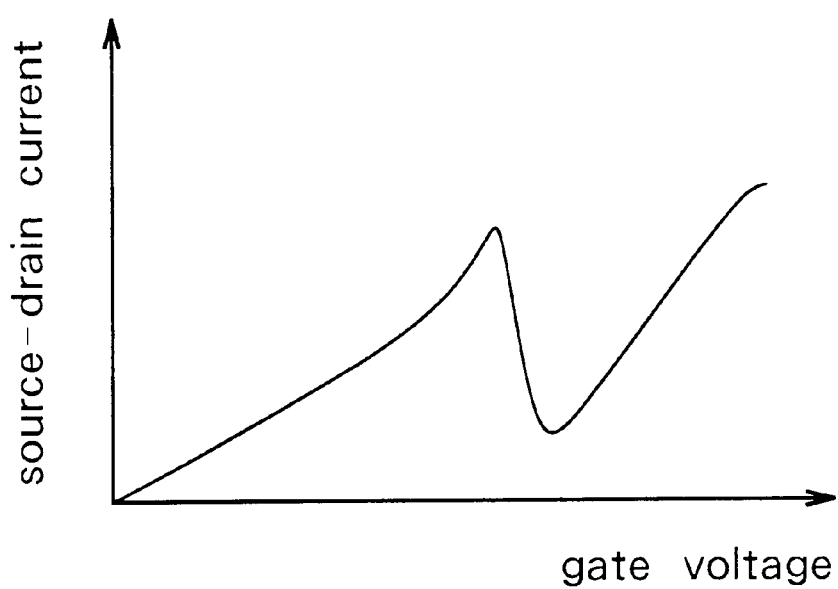
FIG. 15 is a plot for illustrating a relationship between the source-drain current and gate voltage of the quantum device shown in FIG. 14.

With a further application of positive gate voltage Vg, the number of electrons accumulated in the conduction layer 1a increases with an increase in the gate voltage and the current thereby increases. It is therefore noted for the quantum device of the embodiment that the relationship between the current flowing through the conduction layer 1a (source-drain current) and gate voltage Vg is expressed as a many-valued function as shown in FIG. 15.

The quantum device may be fabricated in a manner similar to that of the first embodiment.

As described so far, the quantum device of the embodiment comprises the coupled quantum well layer 10 adjacent to the conduction layer 1a. It is thus possible to change gate voltage Vg and the current flowing through the conduction layer 1a as a many-valued function. The single device is thereby capable of handling many-valued information. The device further achieves current modulation at high speed and low power consumption. Higher integration is achieved as well.

The present invention is not limited to the embodiments described so far but may be practiced in still other ways. For example, although electrons carry data in the foregoing embodiments, holes may carry data instead. The operation in this case is almost similar to that of the foregoing embodiments except that electrons are replaced with holes.

In the foregoing embodiments the quantum well layers 12a and 12b are made of materials of the same composition while thicknesses $w_1$ and $w_2$ are different from each other so that the energy levels will be different from each other. Alternatively, the quantum well layers 12a and 12b may be made of materials of different compositions so as to change the energy levels. For example, the quantum well layers 12a and 12b may be each made of InGaAs mixed crystal or InGaSb mixed crystal and the proportion of indium may be changed between the quantum well layers 12a and 12b.

In the foregoing embodiments the structure of the coupled quantum well layer 10 is the stacked layers of the barrier layer 11a, the quantum well layer 12a, the barrier layer 11b, the quantum well layer 12b and the barrier layer 11c. Alternatively, a plurality of quantum well layers 12a closer to the conduction layer 1a may be provided. That is, a plurality of barrier layers 11a and quantum well layers 12a are alternately stacked on which the barrier layer 11b, the quantum well layer 12b and the barrier layer 11c are stacked. With such a structure, manufacture is facilitated since, for etching the coupled quantum well layer 10 (see FIG. 11B), etching may reach any of the plurality of barrier layers 11a from the one adjacent to the substrate 1 and to the one apart from the substrate 1.

Furthermore, the coupled quantum well layer including three or more of quantum well layers may be fabricated. In this case, the minimum energy levels of electrons may be lower in the quantum well layers closer to the conduction layer 1a in the second embodiment.

As described so far, the quantum device of the invention comprises the coupled quantum well layer. A transition of electrons or holes therefore takes place by means of quantum tunneling between the conduction layer and the coupled quantum well layer. The quantum device may be used as a memory device for performing writing and erasing of data at exceedingly high speed with low power. Microstructuring of the device is achieved as well. The quantum device may be further used as a device for modulating a current so as to change a current flowing through the conduction layer as a many-valued function. As a result, current modulation is performed at high speed and power consumption is reduced. Higher device integration is achieved as well.

The other quantum device of the invention includes the quantum well layer in the transition layer. A transition of electrons or holes therefore takes place between the conduction layer and the accumulation layer by means of resonance tunneling. As a result, writing and erasing of data is performed at exceedingly high speed with low power. Microstructuring of the device is achieved as well.

Obviously many modifications and variations of the present invention are possible in the light of the above teachings. It is therefore to be understood that within the scope of the appended claims the invention may be practiced otherwise than as specifically described.

What is claimed is:

1. A quantum device comprising:
   a conduction layer which has a Fermi level $E_F^{2DEG}$ and through which a current flows;
   a coupled quantum well layer which includes a plurality of quantum well layers and is adjacent to the conduction layer;
   one of said plurality of quantum well layers of said coupled quantum well layer being closer to said conduction layer having a localized minimum energy level of electrons $E_0^{QW1}$ in a thermal equilibrium state;
   another of said plurality of quantum well layers of said coupled quantum well layer being opposite said conduction layer and having a localized minimum energy level of electrons $E_0^{QW2}$ in a thermal equilibrium state; and
   a gate electrode placed adjacent to said coupled quantum layer opposite said conduction layer;
   wherein,
   $E_0^{QW1} > E_0^{QW2} + k_B T$, where $k_B$ is Boltzmann constant and T is an absolute temperature of said device.

2. A quantum device according to claim 1 operatively configured as a memory device wherein electrons are accumulated in said coupled quantum well by means of tunneling between said coupled quantum well layer and said conduction layer by making $E_0^{QW1}$ higher than $E_F^{2DEG}$ by applying gate voltage Vg to said gate electrode.

3. A quantum device according to claim 1 wherein the coupled quantum well layer includes the quantum well layers made of InAs or InGaAs mixed crystal and barrier layers made of GaAs, AlGaAs mixed crystal, GaSb or AlGaSb mixed crystal.

4. A quantum device according to claim 1 wherein the coupled quantum well layer includes the quantum well layers made of GaAs and barrier layers made of AlGaAs mixed crystal.

5. A quantum device according to claim 1 wherein the coupled quantum well layer includes the quantum well layers made of silicon and barrier layers made of silicon dioxide.

6. A quantum device according to claim 1 wherein the coupled quantum well layer includes the quantum well layers made of germanium and barrier layers made of silicon.

7. A quantum device according to claim 1 operatively configured as a memory device capable of retaining information wherein a number of electrons accumulated in said coupled quantum well is controlled with a gate voltage Vg applied to said gate electrode and a difference in said number is stored as a difference in information.

8. A quantum device comprising:
   a conduction layer which has a Fermi level $E_F^{2DEG}$ and through which a current flows;
   a coupled quantum well layer which includes a plurality of quantum well layers and is placed adjacent to said conduction layer;
   a quantum well layer of said coupled quantum well layer closer to said conduction layer having a localized minimum energy level of electrons $E_0^{QW1}$ in a thermal equilibrium state;
   a quantum well layer of said coupled quantum well layer opposite to said conduction layer having a localized minimum energy level of electrons $E_0^{QW2}$ in a thermal equilibrium state; and
   a gate electrode placed adjacent to said coupled quantum layer opposite to said conduction layer,
   wherein,
   $E_0^{QW1}$ is lower than $E_0^{QW2}$.

9. A quantum device according to claim 8, wherein electrons are accumulated in the coupled well layer in said coupled quantum well by means of tunneling between said coupled quantum well layer and said conduction layers by making $E_0^{QW1}$ lower than $E_F^{2DEG}$ by applying gate voltage Vg to said gate electrode.

10. A quantum device according to claim 8, wherein a number of said electrons accumulated in said coupled quantum well layer is controlled with a gate voltage Vg applied to said gate electrode and a current flowing through said conduction layer is modulated in accordance with a difference in the number of electrons accumulated.

11. A quantum device according to claim 8, wherein said coupled quantum well layer includes quantum well layers made of InAs or InGaAs mixed crystal and barrier layers made of GaAs, AlGaAs mixed crystal, GaSb or AlGaSb mixed crystal.

12. A quantum device according to claim 8, wherein said coupled quantum well layer includes quantum well layers made of GaAs and barrier layers made of AlGaAs mixed crystal.

13. A quantum device according to claim 8, wherein said coupled quantum well layer includes quantum well layers made of silicon and barrier layers made of silicon dioxide.

14. A quantum device according to claim 8, wherein said coupled quantum well layer includes quantum well layers made of germanium and barrier layers made of silicon.

* * * * *